(12) United States Patent
Cha et al.

(10) Patent No.: US 10,329,139 B2
(45) Date of Patent: Jun. 25, 2019

(54) INTERFACIAL CONVECTIVE ASSEMBLY FOR HIGH ASPECT RATIO STRUCTURES WITHOUT SURFACE TREATMENT

(75) Inventors: Nam-Goo Cha, Ansan (KR); Yolanda Echegoyen, Somerville, MA (US); Ahmed Busnaina, Needham, MA (US); Taehoon Kim, Revere, MA (US)

(73) Assignee: Northeastern University, Boston, MA (US)

( * ) Notice: Subject to any disclaimer, the term of this patent is extended or adjusted under 35 U.S.C. 154(b) by 1686 days.

(21) Appl. No.: 13/702,133

(22) PCT Filed: Jun. 7, 2011

(86) PCT No.: PCT/US2011/039388
§ 371 (c)(1),
(2), (4) Date: Jul. 15, 2013

(87) PCT Pub. No.: WO2011/156330
PCT Pub. Date: Dec. 15, 2011

(65) Prior Publication Data
US 2013/0287999 A1 Oct. 31, 2013

Related U.S. Application Data

(60) Provisional application No. 61/352,523, filed on Jun. 8, 2010.

(51) Int. Cl.
*B05D 1/36* (2006.01)
*B81B 1/00* (2006.01)
(Continued)

(52) U.S. Cl.
CPC ............ *B81B 1/002* (2013.01); *B05D 1/00* (2013.01); *B05D 1/36* (2013.01); *B05D 7/22* (2013.01);
(Continued)

(58) Field of Classification Search
CPC ...................................................... B05D 1/36
(Continued)

(56) References Cited

U.S. PATENT DOCUMENTS 3,485,658 A * 12/1969 Iler .................. C03C 17/00
427/354
5,355,577 A 10/1994 Cohn
(Continued)

FOREIGN PATENT DOCUMENTS

WO WO-96/29629 A3 9/1996

OTHER PUBLICATIONS

Fan et al. Assembly of Colloidal Particles by Evaporation on Surfaces with Patterned Hydrophobicity. Langmuir 2004, 20, 3062-3067.*
(Continued)

*Primary Examiner* — Cachet I Sellman
(74) *Attorney, Agent, or Firm* — Arent Fox LLP (57) ABSTRACT

A method for assembling colloidal particles onto a substrate surface through fluid transport. The method comprises placing a first fluid placed adjacent to the substrate surface, applying a colloidal dispersion on top of the first fluid layer and removal of the first fluid layer. The method is extremely versatile, and is especially useful in depositing colloidal materials in high aspect ratio channels and vias without the need for prior treatment of the surface.

53 Claims, 7 Drawing Sheets

(51) Int. Cl.
*B05D 1/00* (2006.01)
*B05D 7/22* (2006.01)
*C23C 26/00* (2006.01)
*B32B 3/18* (2006.01)
*B81C 1/00* (2006.01)

(52) U.S. Cl.
CPC .............. *B32B 3/18* (2013.01); *B81C 1/0038* (2013.01); *B81C 1/00373* (2013.01); *C23C 26/00* (2013.01); *B05D 2401/32* (2013.01); *B22F 2998/00* (2013.01); *Y10T 428/24355* (2015.01); *Y10T 428/24562* (2015.01)

(58) Field of Classification Search
USPC .................................... 977/733; 427/180, 74
See application file for complete search history.

(56) References Cited

U.S. PATENT DOCUMENTS

| | | | |
|---|---|---|---|
| 5,512,131 | A | 4/1996 | Kumar et al. |
| 5,545,291 | A | 8/1996 | Smith et al. |
| 5,900,160 | A | 5/1999 | Whitesides et al. |
| 6,180,239 | B1 | 1/2001 | Whitesides et al. |
| 6,929,764 | B2 | 8/2005 | Jiang et al. |
| 7,520,933 | B2 | 4/2009 | Park et al. |
| 2003/0087068 | A1* | 5/2003 | Chopra ..................... B32B 5/02 428/199 |
| 2005/0255236 | A1* | 11/2005 | Deng ..................... B05D 7/222 427/180 |
| 2005/0281944 | A1* | 12/2005 | Jang ..................... B05D 1/202 427/180 |
| 2007/0145540 | A1* | 6/2007 | Mochida ............. H01L 23/4334 257/659 |
| 2008/0020208 | A1* | 1/2008 | Lee ..................... H01L 51/0035 428/411.1 |
| 2010/0009165 | A1* | 1/2010 | Patel ........................ C09D 5/24 428/323 |
| 2010/0092809 | A1* | 4/2010 | Drzal ................. H01M 4/0416 429/413 |

OTHER PUBLICATIONS

International Search Report and Written Opinion issued by the U.S. Patent and Trademark Office as International Searching Authority for International Application No. PCT/US11/39388 dated Nov. 17, 2011 (9 pages).
Kralchevsky, P. A. and Nagayama, K., "Capillary Forces Between Colloidal Particles," Langmuir, vol. 10, pp. 23-36 (1994).
Mirkin, C. A. et al., "A DNA-based Method for Rationally Assembling Nanoparticles into Macroscopic Materials," Nature, vol. 382, pp. 607-609 (Aug. 15, 1996).
Philp, D. and Stoddart, J. F., "Self-Assembly in Natural and Unnatural Systems," Angewandte Chemie International Edition, vol. 35, No. 1, pp. 1154-1196, 43 pages (Jun. 17, 1996).
Whitesides, G. M. et al., "Noncovalent Synthesis: Using Physical-Organic Chemistry To Make Aggregates," Acc. Chem. Res., vol. 28, No. 1, pp. 37-44 (1995).
Whitesides, George M., "Self-Assembling Materials," Scientific American, vol. 273, pp. 146-149 (Sep. 1995).
Wu, S.-K. et al., "Self-Assembly Of Polystyrene Microspheres Within Spatially Confined Rectangular Microgrooves," Journal of Materials Science, vol. 43, No. 19, pp. 6453-6458 (Oct. 2008).
Yamaki, M. et al., "Size-Dependent Separation of Colloidal Particles in Two-Dimensional Convective Self-Assembly," Langmuir, vol. 11, No. 8, pp. 2975-2978 (1995).

* cited by examiner

INTERFACIAL CONVECTIVE ASSEMBLY FOR HIGH ASPECT RATIO STRUCTURES WITHOUT SURFACE TREATMENT

CROSS-REFERENCE TO RELATED APPLICATIONS

This claims priority to U.S. Patent Application Ser. No. 61/352,523 filed on Jun. 8, 2010, the disclosure of which is hereby incorporate by reference as if set forth in its entirety herein.

GOVERNMENT RIGHTS

This work was supported in part by the National Science Foundation (Grant Nos. 0425826/0832785) and the U.S. Government has certain rights in this invention.

TECHNICAL FIELD

The present invention relates generally to methods of self-assembly, particularly to self-assembly of component articles, including those spanning the nanometer to micron range, and more particularly into micro- and/or nanodimensioned vias and channels of composite articles.

BACKGROUND

Controlling the deposition of nano-dimensioned solids at the nanometer scale has the potential to revolutionize technology through development of materials and devices with control of mechanical, optical, electronic and structural properties. Moreover, recent research has led to a host of new fundamental scientific insights, including controlled nanoscale synthesis and processing of both organic (soft) and inorganic (hard) material and the development of nanoscale precursors for these macroscopic materials and devices. A challenge, therefore, is to develop an approach that can combine a variety of organic and inorganic building blocks, provide down to nanometer-scale structural control and simultaneously lead to macroscopic devices or materials in a practical and cost-effective way. Moreover, the approach must be flexible so that it can be readily extended to a variety of materials or properties without substantial revision of the entire process. These are demanding goals that require novel approaches and development of basic science.

Conventional metal deposition methods such as sputtering or evaporation have poor selectivity, required elevated temperature and need special vacuum systems. Methods such as dip-coating using colloidal suspensions take long time and are difficult to apply on thin and bendable substrates. Photolithography provides a means of generating structure, generally planar in nature, with a spatial resolution on the nanometer to micron size scale, but this technique is limited to a small set of materials.

Chemical synthesis, for example synthesizing carbon and other nanotubes, can provide molecular resolution, but is limited in its ability to independently control mechanical, structural, electronic and optical properties of a material.

One technique of recent interest involves the selective deposition of nano- or micro-dimensioned particles by self-assembly. Self-assembly is a term used to define the spontaneous association of entities into structural aggregates. In particular, molecular self-assembly provides the basis for a successful strategy for generating large, structured molecular aggregates, by the spontaneous association of molecules. See, for example, Whitesides, et al., in "Noncovalent Synthesis: Using Physical-organic Chemistry to Make Aggregates", Accts. Chem. Res., 28, 37-44 (1995); Whitesides, G. M., "Self-Assembling Materials", Scientific American, 273, 146-149 (1995); Philip, et al., Angew. Chem., Int. Ed. Engl., 35, 1155-1196 (1996).

Self-assembly of molecules can be made to occur spontaneously at liquid/gas, liquid/liquid, or solid/liquid interfaces to form self-assembled monolayers of the molecules when the molecules have a shape that facilitates ordered stacking in the plane of the interface and each includes a chemical functionality that adheres to the surface or in another way promotes arrangement of the molecules with the functionality positioned adjacent the surface. U.S. Pat. No. 5,512 131, and U.S. patent application Ser. Nos. 08/695, 537, 08/616,929, 08/676,951, and 08/677,309, and International Patent Publication No. WO 96/29629, all commonly-owned, describe a variety of techniques for arranging patterns of self-assembled monolayers at surfaces for a variety of purposes.

Much of the literature in this area describes the self-assembly of forming extended colloidal structures, but several techniques are described for forming such nano- and microscale patterning, including tethering colloidal gold nanoparticles to surfaces with thiol groups (Mirkin, et al., A DNA-Based Method for Rationally Assembling Nanoparticles Into Macroscopic Materials, Nature, 382, (Aug. 15, 1996)).

The concept of using capillary action to deposit colloid or nano-materials has been described as useful in providing patterned self-assembled arrays. Yamaki, et al., in "Size Dependent Separation of Colloidal Particles in Two-Dimensional Convective Self-Assembly" Langmuir, 11, 2975-2978 (1995), relies on lateral capillary force and convective flow to provide "convective self-assembly" of colloidal particles ranging in size from 12 nm to 144 nm in diameter in a wetting liquid film on a mercury surface. Cralchevski, et al., in "Capillary Forces Between Colloidal Particles" Langmuir, 10, 23-36 (1994), describe capillary interactions occurring between particles protruding from a liquid film due to the capillary rise of liquid along the surface of each particle.

Shi-Kai Wu, et al., "Self Assembly of Polystyrene Microspheres Within Spatially Confined Rectangular Microgrooves," J. Matl. Sci., 43 (19), 6453-6458 (2008) describes the use of capillary action to self-assemble 262 to 1000 nm polystyrene spheres onto patterned silicon wafers with one-dimensional microgrooves of different widths (0.76 -6 microns). Processing variables including evaporation temperature, particle size, groove width, and groove height were examined to explain the results.

O-Ok Park, et al., "Method for Manufacturing Colloidal Crystals Via Confined Convective Assembly," U.S. Pat. No. 7,520,933, issued Apr. 21, 2009, discloses methods of manufacturing colloidal crystals using a confined convective assembly, comprising infusing colloidal suspension between two substrates and self-assembling the particles by capillary action. Substrates may include glass, inorganic and organic polymers; particles may include high molecular weight polymers, inorganic polymers, metals, and metal oxides. Solvents useful for the convective transfer include water and alcohol.

Peng Jiang, et al., "Polymers Having Ordered Monodisperse Pores and Their Corresponding Ordered, Monodisperse Colloids," U.S. Pat. No. 6,929,764 (issued Aug. 16, 2005) describes the deposition of nano-silica "according to an appropriate technique, such as . . . convective self-assembly method."

U.S. Pat. No. 5,45,291 (Smith) describes assembly of solid microstructures in an ordered manner onto a substrate through fluid transfer. The microstructures are shaped blocks that, when transferred in a fluid slurry poured onto the top surface of a substrate having recessed regions that match the shapes of the blocks, insert into the recessed regions via gravity. U.S. Pat. No. 5,355,577 (Cohn) describes a method of assembling discrete microelectronic or micro-mechanical devices by positioning the devices on a template, vibrating the template and causing the devices to move into apertures. The shape of each aperture determines the number, orientation, and type of device that it traps.

Self-assembly on patterned surfaces is particularly useful as a way of making nano- and microscale devices, for example electronic and electrochemical systems, sensors, photonic devices, biosensors and devices, information storage medium, display devices and optical devices, and medical (e.g., drug release) devices.

However, when attempting to apply convective self-assembly, several problems become evident. These particular problems include difficulties in depositing colloidal particles into high aspect ratio trenches or wells.

The main problem in hydrophobic structures with high aspect ratio is that water cannot penetrate and touch the bottom surface, so it is impossible to use liquid assembly techniques as dip-coating or convective assembly. Conventional plastic substrates show water contact angles around 100° and they are usually reduced applying $O_2$ plasma or UV radiation to make the surface hydrophilic (contact angle below 20°). This problem is exacerbated in high aspect ratio nanostructures showed super-hydrophobicity (130°) before applying $O_2$ plasma and a high contact angle (90°) after the plasma was applied. Also, $O_2$ plasma is known to destroy or erode plastic patterns.

Another problem is that plastic substrates are usually thin and easy to bend and it is difficult to make conformal assembly at large areas.

Still another problem is that the time necessary for particles to move from, typically, aqueous dispersions into high aspect ratio features (e.g., vias and trenches) tends to be long. All of these problems become increasingly acute as the dimensions of the vias and trenches shrink, and are especially problematic for nano-dimensioned features.

What is needed is a versatile technique for facilitating convective self-assembly that accommodates a wide range of nano- or microparticles, works quickly over large areas, when the particles (or other nano- or micro-building blocks) have to be assembled into deep trenches or vias, whether the surface is hydrophobic or hydrophilic, without surface treatment.

SUMMARY

The present invention is directed to a method of facilitating convective self-assembly that accommodates a wide range of colloidal particles, works quickly over large areas, when the colloidal particles (or other nano- or micro-dimensioned building blocks) have to be assembled into deep channels, holes, wells, or vias, whether the surface is hydrophobic or hydrophilic, without the need for high vacuum or surface treatment. As such, the various embodiments described herein provide a flexible and cost effective approach to achieving its intended purpose.

One embodiment of this invention is a method for depositing colloidal particles onto a substrate surface comprising: (a) providing a substrate having a surface; (b) depositing a first layer of a first fluid onto the surface of the substrate; and (c) depositing a second layer of an aqueous dispersion of colloidal particles on top of the first layer of the first fluid; and (e) removing the first layer of the first fluid. This process results in the colloidal particles forming a layer on the surface of the substrate, either over the entire substrate or over portions of the substrate. Additional and separate additive embodiments include this first embodiment plus either (d) optionally covering the second layer with a cover so as to forming an assembly comprising a sandwich of the first and second layers between the substrate and the cover or (f) removing the water from the second layer of the aqueous dispersion, leaving a layer of particles on the surface of the substrate, or both (d) and (f).

The method is flexible in that is allows that the surface of the substrate can be either hydrophobic or hydrophilic, or may comprise sections which are both hydrophobic and hydrophilic. Further, the substrate may be flat or curved, may be flexible or rigid, or comprise a shape memory material. The substrate may comprise a bulk material or at least a partial surface coating comprising one or more glass, organic polymer, inorganic polymer, ceramic, metal, or metalloid, or an area or layered combination or mixture thereof.

The invention teaches that the substrate may contain patterned features which either protrude or contain recesses or indentations (e.g., channels, trenches, and/or holes, wells, or vias).

Certain embodiments provide that the substrate comprises insulative, conductive, or semi-conductive materials. Within these categories, the substrate may comprise one or more glass, inorganic or organic polymers, crystalline or polycrystalline ceramic, metal, or metalloid. The substrate surface comprises patterned micro- and/or nano-dimensioned features. Such micro- and/or nano-dimensioned features include channels or trenches or holes, wells, or vias which may be formed into the substrate or by protruding surfaces. These surfaces may or may not be used in combination with some form of chemical or physical etching.

In other separate embodiments, the first layer of a first fluid and the second layer of the aqueous dispersion may be applied by spin-, dip-, brush-, or spray-coating, or by the application of a droplet using methods known to those skilled in the art.

In combination with any of the preceding or succeeding embodiments, various embodiments of the method provides that the first fluid wets the substrate. Such embodiments can be accomplished with fluids comprising one or more of various organic liquids, for example alcohols, aromatics, amines, esters, hydrocarbons, or ketones, or mixtures thereof. Isopropanol is a particularly well suited organic fluid to be used in this invention.

The physical properties of boiling point (or more generally, the vapor pressure at the then ambient temperature), the viscosity, specific gravity, and the surface tension of the first fluid all impact the efficiency of the method. In certain embodiments, this first fluid may be immiscible, partially miscible, or completely miscible with water and/or the aqueous dispersions of the colloidal particles.

The aqueous layer comprises water and colloidal particles, and may include other materials including surfactants, colorants, fluorescents, markers, preservatives, and/or soluble dopants depending on the final application. Virtually any potentially available secondary material can be used, provided they do not substantively interfere with the ability of the layer to deliver and deposit the colloidal particles to the surface of the substrate.

The first layer may be removed using several techniques, including by the application of heat or vacuum or both. In such cases, the first layer may be removed by some contribution of evaporation or commingling with, and incorporating into, the aqueous phase, or both. Once the first fluid is removed, and the colloidal particles are deposited, the invention describes that the liquid portion of the aqueous dispersion is removed by the application of heat or vacuum or both. Generally, the application of heat is referring to temperatures of about 80° C. or less, about 60° C. or less, about 40° C. or less, or so-call room ambient temperatures (e.g., ca. 20-25° C.). The skilled artisan will appreciate that higher temperatures will cause faster evaporation, though the speed of evaporation is balanced against the homogeneity and/or selectivity he or she wishes to attain.

It should be appreciated that articles produced by these methods are also within the scope of this invention. Such articles include, for example, chemical, biochemical, electrical, electromagnetic field or frequency sensors, information storage media, energy storage units, energy conversion cells, display devices, or video or optical devices. More complicated systems are also contemplated herein, including chemical, biochemical, electrical, or electromagnetic field or frequency sensing systems, information transfer or communication systems, energy storage or conversion systems, or video or optical communication systems comprising a device made by these methods.

BRIEF DESCRIPTION OF THE DRAWINGS

FIG. 4A shows the substrate before assembly. FIG. 4B shows that large area after assembly. FIG. 4C shows a bended area after assembly. FIG. 4D shows the assembly at high magnification.

FIG. 7(A) is a fluorescent microscope image, and FIG. 7(B) is an SEM image

DETAILED DESCRIPTION OF ILLUSTRATIVE EMBODIMENTS

The present invention is directed to a method of facilitating convective self-assembly that accommodates a wide range of colloidal particles, works quickly over large areas, when the colloidal particles (or other nano- or micro-dimensioned building blocks) have to be assembled into deep channels, holes, wells, or vias, whether the surface is hydrophobic or hydrophilic, without the need for high vacuum or surface treatment. As such, the various embodiments described herein provide a flexible and cost effective approach to achieving its intended purpose.

The present invention may be understood more readily by reference to the following detailed description taken in connection with the accompanying Figures and Examples, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the method of preparing such devices and to the resulting, corresponding physical devices themselves, as well as the referenced and readily apparent applications for such devices.

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When values are expressed as approximations, by use of the antecedent "about," it will be understood that the particular value forms another embodiment. In general, use of the term "about" indicates approximations that can vary depending on the desired properties sought to be obtained by the disclosed subject matter and is to be interpreted in the specific context in which it is used, based on its function, and the person skilled in the art will be able to interpret it as such. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Generally terms are to be given their plain and ordinary meaning such as understood by those skilled in the art, in the context in which they arise. To avoid any ambiguity, however, several terms are described herein.

One embodiment of this invention is a method for depositing colloidal particles onto a substrate surface comprising: (a) providing a substrate having a surface; (b) depositing a first layer of a first fluid onto the surface of the substrate; and (c) depositing a second layer of an aqueous dispersion of colloidal particles on top of the first layer of the first fluid; and (e) removing the first layer of the first fluid. This process results in the colloidal particles forming a layer on the surface of the substrate, either over the entire substrate or over portions of the substrate. Additional and separate additive embodiments include this first embodiment plus either (d) optionally covering the second layer with a cover so as to forming an assembly comprising a sandwich of the first and second layers between the substrate and the cover or (f) removing the water from the second layer of the aqueous dispersion, leaving a layer of particles on the surface of the substrate, or both (d) and (f).

Figure 1:
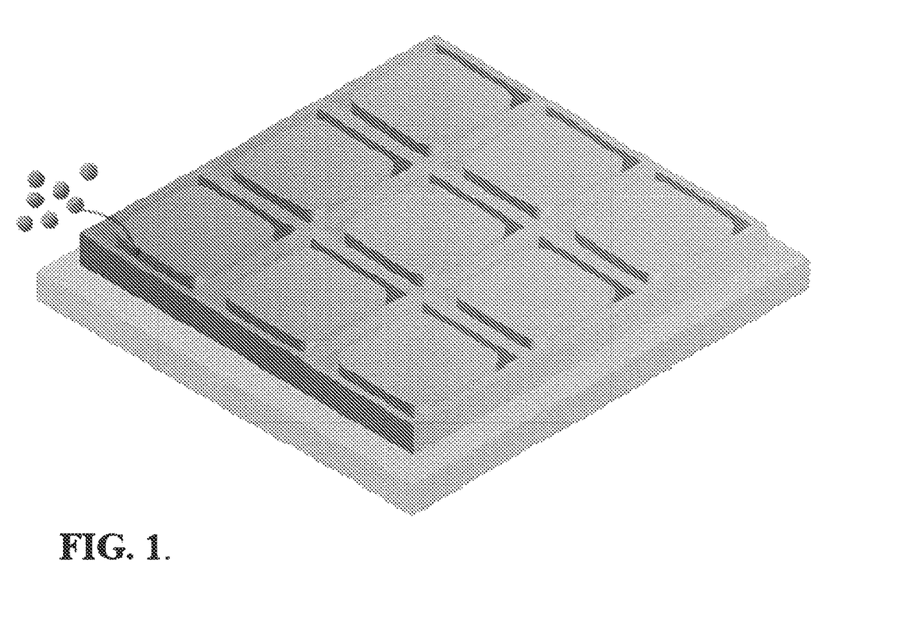
FIG. 1 illustrates a substrate containing patterned features; when made of polyethylene, it also represents a super-hydrophobic structure.
Figure 2:
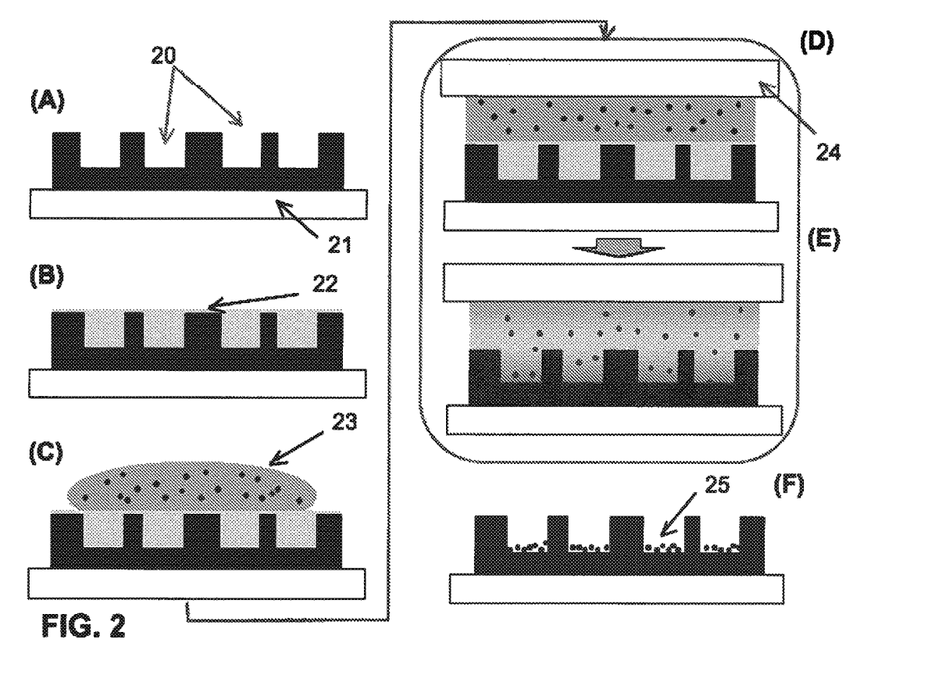
FIG. 2 is a schematic illustration of one embodiment of the inventive procedure.

These steps are shown schematically in FIGS. 1 and 2. FIG. 1 shows a substrate containing patterned channels. A cross-sectional view of a similar configuration is shown in FIG. 2A, showing a pattern having high aspect ratio channels 20 having been applied to a glass substrate 21. In FIG. 2B, a layer of the first fluid 22 is applied to the pattern. In FIG. 2C, a layer of aqueous colloidal material 23 is applied on top of this first layer, and in FIG. 2D an optional cover plate 24 is placed on top of the aqueous colloidal layer 23, to provide conformal water film thickness. In the particular embodiment shown in FIG. 2E, heat is applied to accelerate the mass exchanges between the two layers using interfacial convection, and in FIG. 2F, both fluid layers have been removed, leaving behind deposited colloidal particles 25.

Figure 3:
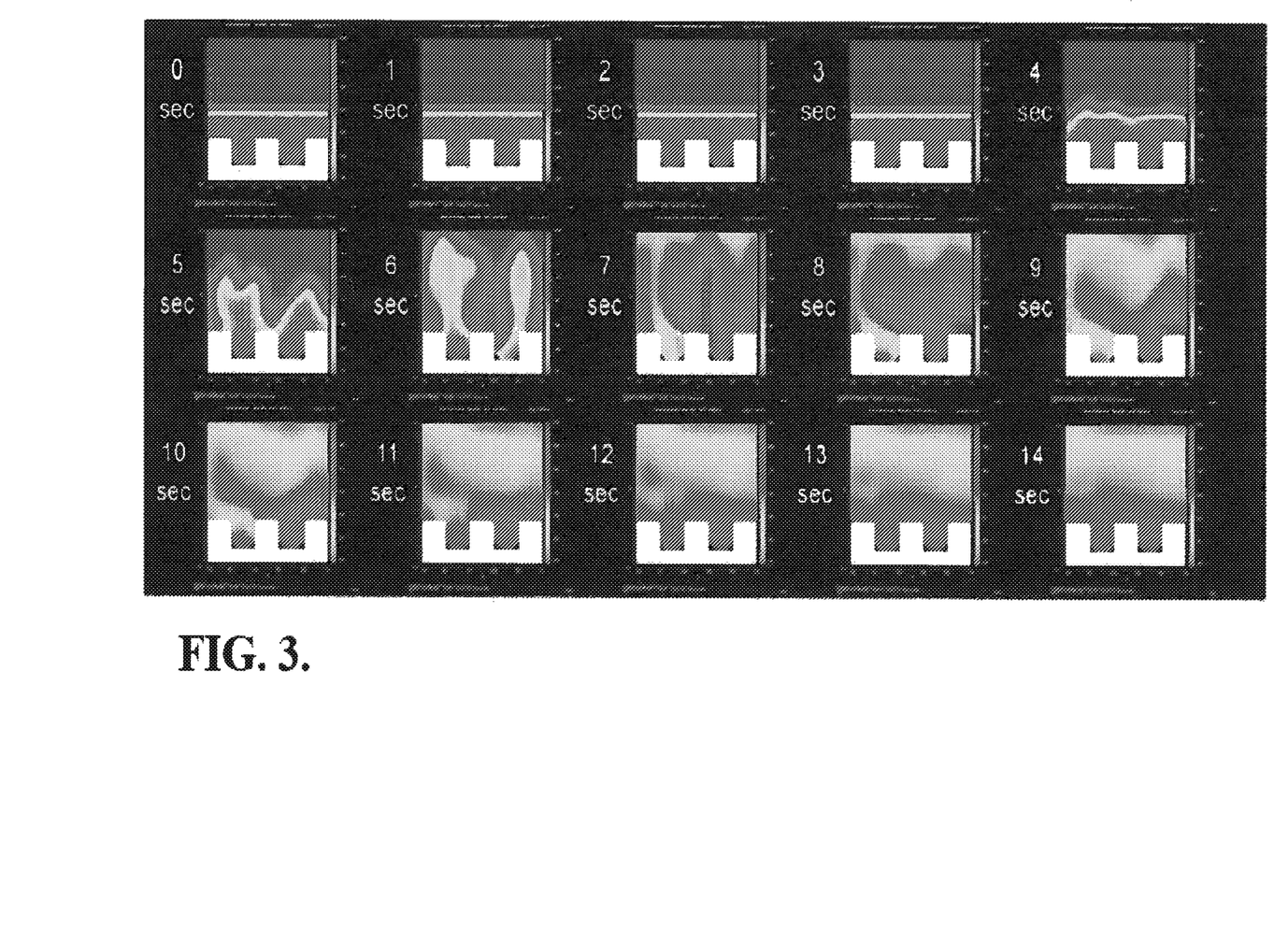
FIG. 3 is a numerical simulation of convective flow between two different layers at room temperature.

FIG. 3 shows a numerical simulation of convective flow between the first layer of first fluid and the water of the aqueous colloidal layer.

Figure 4:
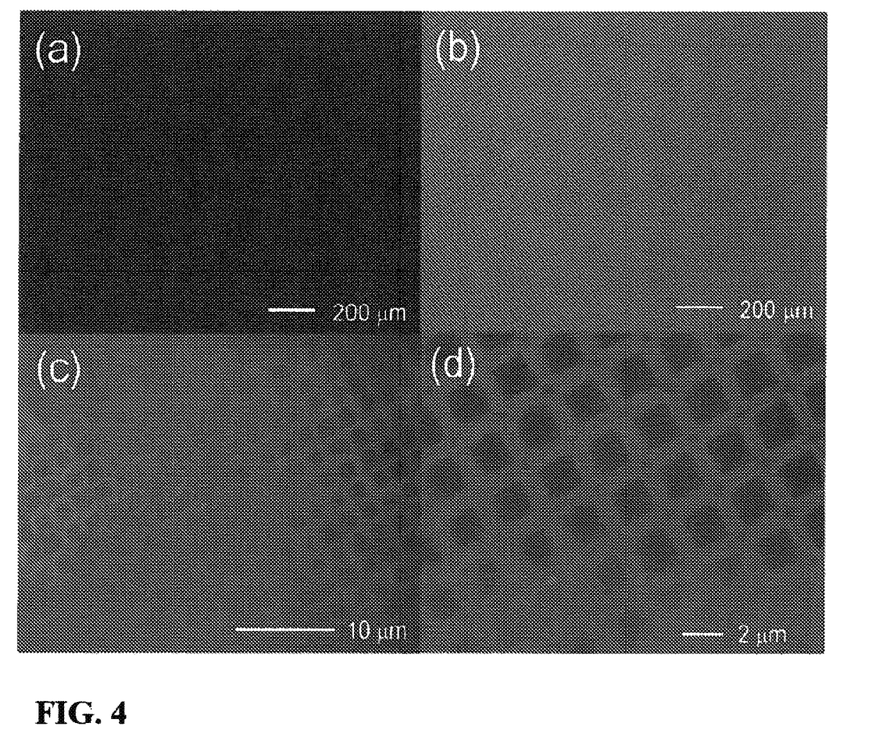
FIG. 4 provides fluorescent microscope images of selective assembly using 22 nm PSL particles. In this case, the substrate is polyethylene, which is highly hydrophobic, exhibiting a contact angle of 110-130°.
Figure 5:
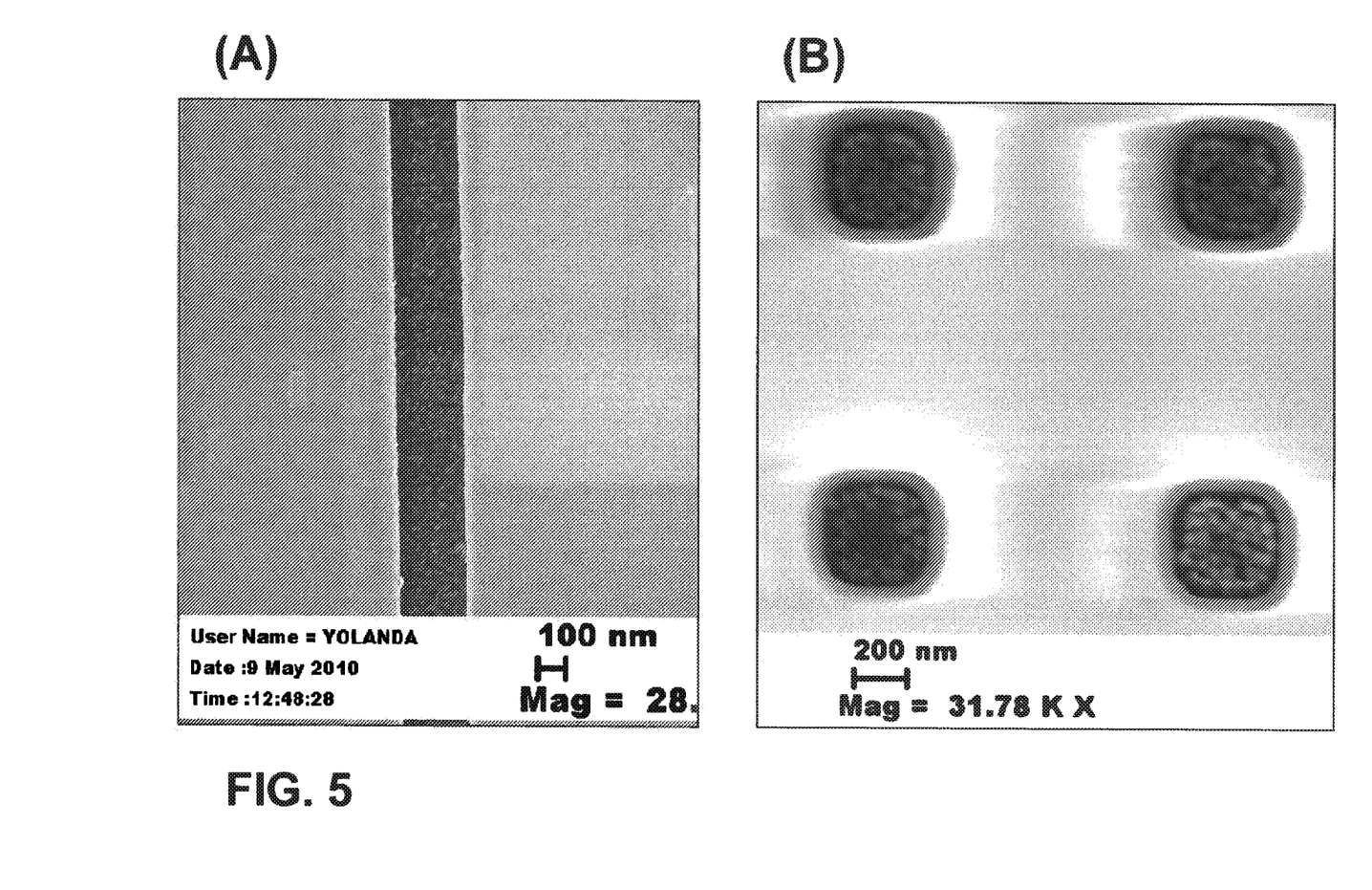
FIG. 5 shows 5 nm gold particles assembled in 300 nm trenches (FIG. 5(A)) and 50 nm gold particles assembled in 300 nm vias (FIG. 5(B)).
Figure 6:
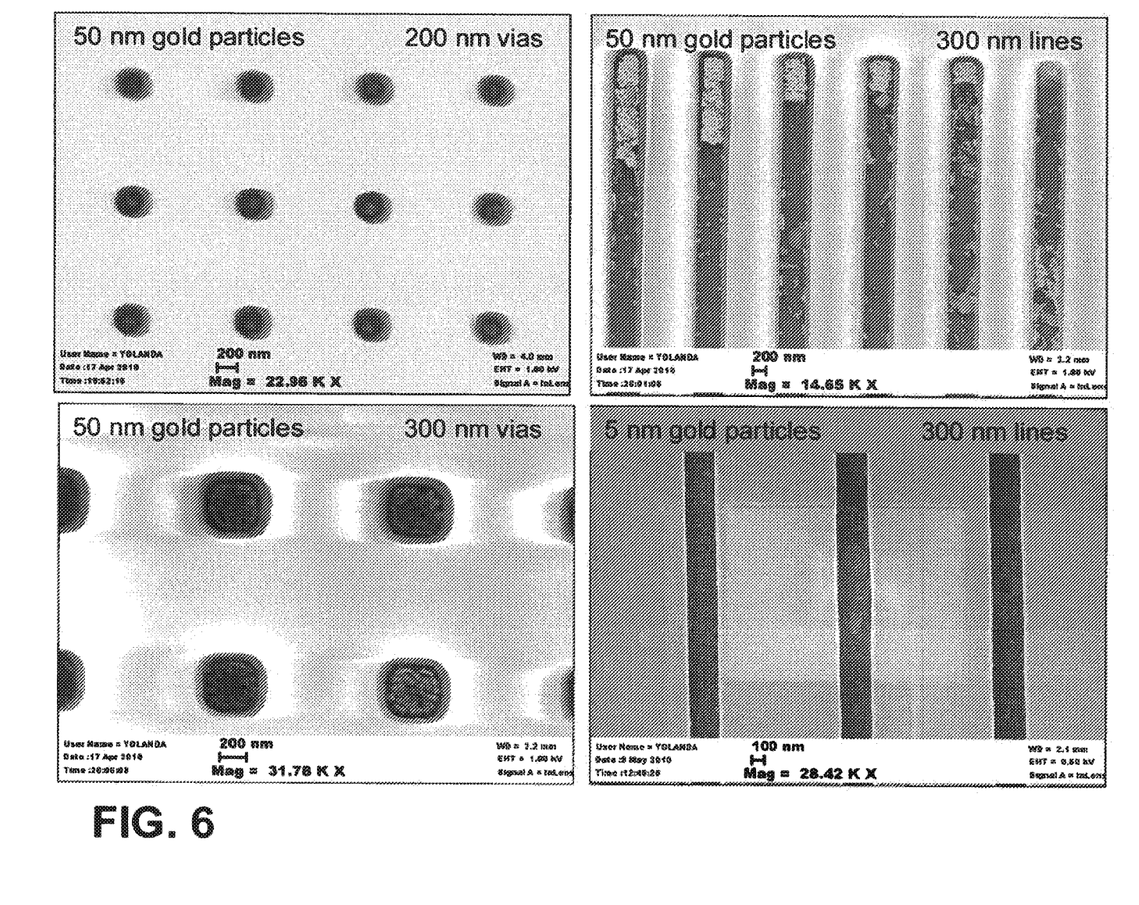
FIG. 6 provides SEM images of selective assembly using 5 and 50 nm gold particles in 200 and 300 nm vias and trenches. In this case, the substrate is PMMA, which is hydrophobic, exhibiting a contact angle of approximately 70°.
Figure 7:
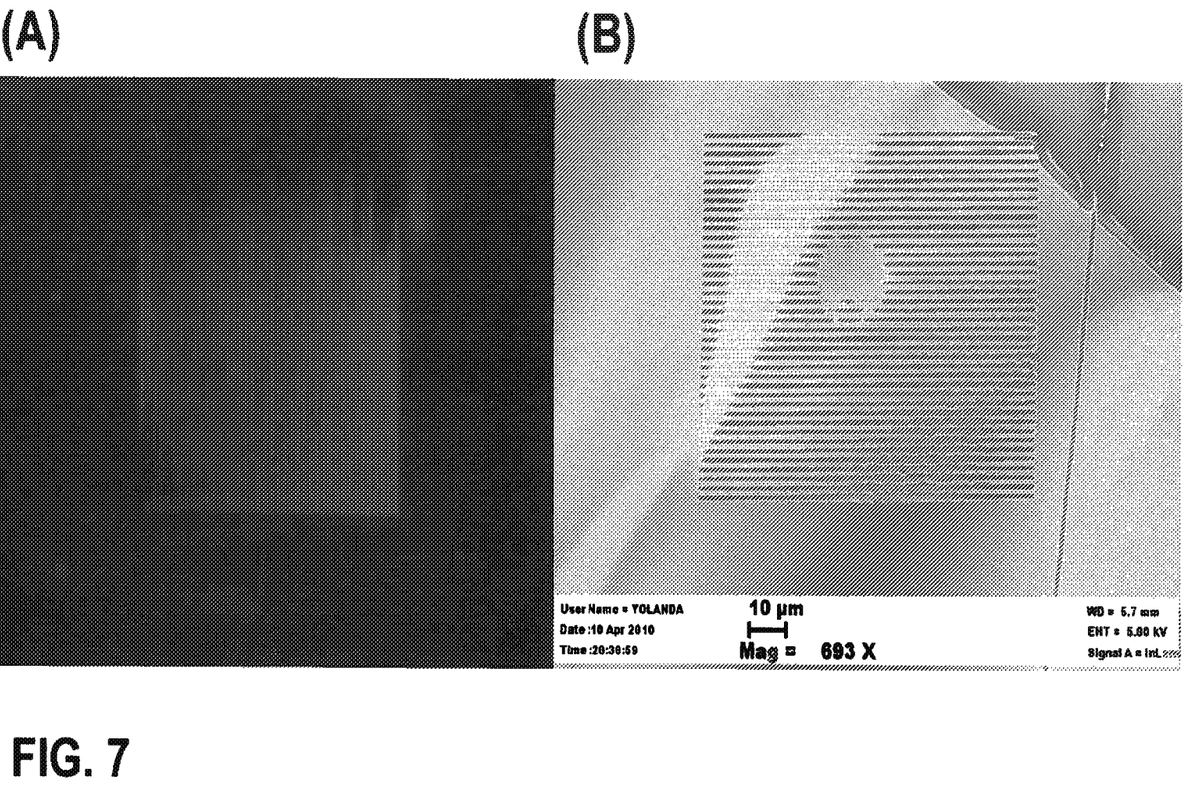
FIG. 7 provides images of selective assembly using 50 nm PSL particles. In this case, the substrate is $SiO_2$, which is hydrophilic, exhibiting a contact angle of less than 20°.

FIG. 4 shows fluorescent microscope images of selective self assembly using 22 nm polystyrene latex (PSL) particles. Of particular interest, FIG. 4D shows the selectivity of the deposition relative to the entire surface.

It should also be appreciated that any of the embodiments described herein may be employed more than once to the same substrate, either in different or over the same areas of the substrate, such that the substrate may ultimately comprise multiple layers of colloidal particles, such that these particle layers may or may not overlap one or more preceding layer, and the individual layers may comprise the same or different materials.

As used herein, the term "nano-" as in "nano-dimensioned," "nano-scale," or "nano-structured" refers to a dimension, scale, or structure having at least one dimension in the range of 0.5 to about 1000 nm, preferably in the range of about 1 to about 500 nm, more preferably in the range of about 5 to about 350 nm, more preferably in the range of about 5 to about 250 mu, still more preferably in the range of about 10 to about 100 nm; i.e., having a dimension in the range independently bounded at the lower end by about 0.5, 1, 5, 10, 15, 20, 25, 50, 75, 100, 250, or 500 nm and at the upper end by about 1000, 750, 500, 350, 250, 150, 100, 50, 25, and 10 nm. Non-limiting exemplary ranges, for example, include those in the range of about 5 to about 50 nm, about 50 to about 100 nm, about 100 to about 350 nm, about 75 to about 500 nm, or about 500 to about 1000 nm. When the terms "nano-channel" or "nano-trench" is used herein, these nano-dimensions refer at least to the width of said "nano-channel" or "nano-trench."

As used herein, the term "micro-" as in "micro-dimensioned," "micro-scale," or "micro-structured" refers to a dimension, scale, or structure having at least one dimension in the range of about 0.5 to about 1000 micron, preferably in the range of about 1 to about 500 micron, more preferably in the range of about 5 to about 350 micron, more preferably in the range of about 5 to about 250 micron, still more preferably in the range of about 10 to about 100 micron; i.e., having a dimension in the range independently bounded at the lower end by about 0.5, 1, 5, 10, 15, 20, 25, 50, 75, 100, 250, or 500 micron and at the upper end by about 1000, 750, 500, 350, 250, 150, 100, 50, 25, and 10 micron. Non-limiting exemplary ranges, for example, include those in the range of about 1 to about 5 micron, about 5 to about 50 micron, about 50 to about 100 micron, about 100 to about 350 micron, about 75 to about 500 micron, or about 500 to about 1000 microns. When the terms "micro-channel" or "micro-trench" is used herein, these micro-dimensions refer at least to the width of said "micro-channel" or "micro-trench."

As used herein, the term "colloidal" refers to separate embodiments independently comprising either micro- or nano-dimensioned particles or both micro- and nano-dimensioned particles.

The method is flexible in that is allows that the surface of the substrate can be either hydrophobic or hydrophilic, or may comprise sections which are both hydrophobic and hydrophilic. The method is especially discriminating on hydrophobic substrates, especially those containing hydrophobic channels, trenches, holes, wells, or vias. That is, when hydrophilic substrates are subjected to the methods described herein, colloidal materials tend to distribute over much of the entire surface, including within the channels, trenches, holes, wells, or vias, whereas when hydrophobic substrates are subjected to the methods described herein, colloidal materials tend more to aggregate more within the channels, trenches, holes, wells, or vias, and less over the larger hydrophobic surfaces.

Further, the substrate may be flat or curved, may be flexible or rigid, or comprise a shape memory material. The substrate may comprise a bulk material or at least a partial surface coating comprising one or more glass, organic polymer, inorganic polymer, ceramic, metal, or metalloid, or an area or layered combination or mixture thereof. As used herein, the phrase "combination or mixture thereof" is intended to reflect embodiments comprising layered structures of the preceding materials, as well as homogeneous or heterogeneous mixtures of the preceding materials and combinations of layered homogeneous or heterogeneous materials. That is, different areas of the substrate may comprise different materials or mixtures of materials (e.g., where the substrate is a composite of several materials) and/or may comprise layers of different materials, such that one or more of the different materials may be exposed to the environment.

The invention teaches that the substrate may contain patterned features which either protrude or contain recesses or indentations (e.g., channels, trenches, and/or holes, wells, or vias). The terms "channels" and "trenches" carry the same meaning, recognized by those skilled in the art, and may be used interchangeably herein. Similarly, the terms "holes," "wells," and "vias" are intended to reflect recessed or indented features whose presented surface geometry is approximately that of a circle or regular polygon. These patterned features may be lithographically patterned and/or may be provided by other standard semiconductor processing techniques, such as masking, sputtering, chemical vapor deposition, sol-gel processing, plasma deposition or etching, drilling, micromachining, or any combination of these techniques. For example, in but one non-limiting example, the substrate may comprise lithographically patterned sputtered metallic conductors.

Certain embodiments provide that the substrate comprises insulative, conductive, or semi-conductive materials.

The substrate and/or surface may include one or more glass comprising a silicate, borate, or phosphate, or combination or mixture thereof. Inorganic polymers or precursors similarly may include polysiloxanes, including polydimethylsiloxanes, silicates or aluminosilicates, or a combination or mixture thereof.

Other embodiments provide that the substrate and/or surface comprises at least one organic polymer, which may include at least one thermoplastic or thermoset resin or copolymer or mixture thereof. Representative polymers which may be applied include those comprising at least one partially or perfluorinated polymer, a polycarbonate, a polyester, a polyalkylene, a polyacrylate or a polymethacrylate, a polystyrene, or a polyacrylonitrile, or a copolymer, combination, or mixture thereof. The organic polymers can be electrically conductive or semiconductive. Non-limiting examples of such materials include polymers comprising a poly(para-phenylene vinylene), polythiophene, poly(para-phenylene), polyquinoline, polypyrrole, polyacetylene, or polyfluorene, or a copolymer or mixture thereof.

As described herein, the various polymers may comprise materials which are natural, synthetic, biocompatible, biodegradable, non-biodegradable, and/or biosorbable. Unless specifically restricted to one or more of these categories, the polymers may comprise materials from any one of these categories. To be implantable, such as may be required for biosensors, for example, such embodiments provide that the materials used are at least biocompatible, and preferable approved by the United States Food and Drug Administration in the United States (or a corresponding regulatory agency in other countries).

The phrase "synthetic polymer" refers to polymers that are not found in nature, even if the polymers are made from naturally occurring biomaterials. Examples include, but are not limited to, aliphatic polyesters, poly(amino acids), copoly(ether-esters), polyalkylenes oxalates, polyamides, tyrosine derived polycarbonates, poly(iminocarbonates), polyorthoesters, polyoxaesters, polyamidoesters, polyoxaesters containing amine groups, poly(anhydrides), polyphosphazenes, polysiloxanes, and combinations thereof.

The phrase "biocompatible polymer" refers to any polymer (synthetic or natural) which when in contact with cells, tissues or body or physiological fluid of an organism does not induce adverse effects such as immunological reactions and/or rejections and the like. It will be appreciated that a biocompatible polymer can also be a biodegradable polymer.

The phrase "biodegradable polymer" refers to a synthetic or natural polymer which can be degraded (i.e., broken down) in the physiological environment such as by enzymes, microbes, or proteins. Biodegradability depends on the availability of degradation substrates (i.e., biological materials or portion thereof which are part of the polymer), the presence of biodegrading materials (e.g., microorganisms, enzymes, proteins) and the availability of oxygen (for aerobic organisms, microorganisms or portions thereof), carbon dioxide (for anaerobic organisms, microorganisms or portions thereof) and/or other nutrients. Aliphatic polyesters, poly(amino acids), polyalkylene oxalates, polyamides, polyamido esters, poly(anhydrides), poly(beta-amino esters), polycarbonates, polyethers, polyorthoesters, polyphosphazenes, and combinations thereof are considered biodegradable. More specific examples of biodegradable polymers include, but are not limited to, collagen (e.g., Collagen I or IV), fibrin, hyaluronic acid, polylactic acid (PLA), polyglycolic acid (PGA), polycaprolactone (PCL), poly(Lactide-co-Glycolide) (PLGA), polydioxanone (PDO), trimethylene carbonate (TMC), polyethyleneglycol (PEG), Collagen, PEG-DMA, alginate or alginic acid, chitosan polymers, or copolymers or mixtures thereof.

The phrase "non-biodegradable polymer" refers to a synthetic or natural polymer which is not degraded (i.e., broken down) in the physiological environment. Examples of non-biodegradable polymers include, but are not limited to, carbon, nylon, silicon, polyurethanes, polycarbonates, polyacrylonitriles, polyanilines, polyvinyl carbazoles, polyvinyl chlorides, polyvinyl fluorides, polyvinyl imidazoles, polyvinyl alcohols, polystyrenes and poly(vinyl phenols), aliphatic polyesters, polyacrylates, polymethacrylates, acyl-substituted cellulose acetates, nonbiodegradable polyurethanes, polystyrenes, chlorosulphonated polyolefins, polyethylene oxides, polytetrafluoroethylenes, polydialkylsiloxanes, and shape-memory materials such as poly (styrene-block-butadiene), copolymers or mixtures thereof.

Crystalline or polycrystalline ceramic composites may be used as substrates and/or surface coatings where the ceramic comprises a metal or metalloid oxide, nitride, or carbide, or a combination or mixture thereof. Such ceramic compositions may include binary, ternary, quaternary carbide, nitride, or oxide compositions. Non-limiting examples include oxides of aluminum, antimony, calcium, indium, iron, magnesium, nickel, silicon, tin, titanium, zinc, or zirconium; nitrides of aluminum, boron, carbon, silicon, or titanium; and/or carbides of aluminum, boron silicon, or titanium, or solid solutions or mixtures thereof.

In separate embodiments, the conductive materials may comprise metals, including, but not limited to aluminum, gold, silver, platinum, cadmium, copper, nickel, titanium, or iron, or a combination or mixture thereof.

The substrate and/or surface may also comprise metalloid comprising conducting, semi-conducting, or insulating, doped or undoped Si, CdS, CdSe, Ge, GaAs, GaAlAs, ZnS, InP, or Ge, or a combination or mixture thereof.

Silica, glass, polyethylene, or polycarbonate are preferred substrates for these methods.

The methods of the invention further provides embodiments wherein the substrate surface comprises patterned micro- and/or nano-dimensioned features. Such micro- and/or nano-dimensioned features include channels or trenches or holes, wells, or vias which may be formed into the substrate or by protruding surfaces. In one non-limiting example, a 10 nm channel may be formed by lithographically etching it into the substrate surface or by forming protruding structures separated by this distance. The skilled artisan is familiar with the means to form such structures. Preferred embodiments include those where the channel width or hole diameter has dimensions on the order of about 5 nm to 1000 microns, preferably about 10 nm to about 500 nm, more preferably about 50 to about 300 nm, and still more preferably about 100 to about 300 nm, but the full scope of these allowable dimensions is as defined above for nano- and micro-dimensioned features.

The invention is particularly attractive when these channels have aspect ratios of about 10 or more, where aspect ratio is defined to be the ratio of height to width of the channel or the ratio of height to the cross-sectional distance of the hole, well, or via. However, the method is not limited to aspect ratios of this dimension and also includes embodiments where the aspect ratio is about 0.5 or more, about 1 or more, about 2 or more, about 5 or more, about 50 or more, about 75 or more, or about 100 or more. Similarly the ratio of the dimension of the colloidal particle to the width of the channel is important, but the method provides flexibility here as well. In order for the method to provide deposition of the colloidal particle within the channel, the ratio of the channel width to particle size obviously must be at least one, preferably greater than about 2, more preferably greater than about 5, more preferably greater than about 10, more preferably greater than about 20, and still more preferably greater than about 50.

While many of the various embodiments do not include the use of chemical or physical etching to improve the wetting of the substrate surface, many other embodiments provide that such chemical or physical etching be used. In these embodiments, etching can be accomplished by plasma or wet chemical etching, or physical abrasive techniques.

Moving beyond the embodiments related to the substrate, in other separate embodiments, the first layer of a first fluid and the second layer of the aqueous dispersion may be applied by spin-, dip-, brush-, or spray-coating, or by the application of a droplet using methods known to those skilled in the art.

In combination with any of the preceding or succeeding embodiments, various embodiments of the method provides that the first fluid wets the substrate. In the context of this specification, "wetting" is intended to reflect that the contact angle of the fluid with the substrate material is less than the contact angle of water with the same substrate material. Such embodiments can be accomplished with fluids comprising one or more of various organic liquids, for example alcohols, aromatics, amines, esters, hydrocarbons, or ketones. Preferred embodiments of this invention tend to be alcohols, esters, and ketones, especially where the normal boiling point is less than that of water. While obviously, for a given class of organic materials, this boiling point limit depends on a variety of parameters, including, for example, degree of hydrogen bonding, specific geometry, and number and position of double bonds, the skilled artisan would appreciate that generally this refers to preferably $C_{1-5}$ alcohols, ketones, esters, more preferably $C_{1-4}$ alcohols, $C_{1-6}$ ketones and esters, and still more preferably $C_{1-3}$ alcohols, acetone, and ethyl acetate. Isopropanol is a particularly well suited organic fluid to be used in this invention.

The most preferred embodiments of the present invention tend to be these types of chemicals, because of the physical characteristics which they exhibit. Without intending to be bound by any particular theory, it is believed that the use of organic fluids as described herein works is that the first fluid wets the narrow, high aspect ratio channels or features more efficiently than does water. When subjected to heat or vacuum, the first fluid is removed, either by evaporation from beneath or dissolution or commingling in the water or both, depending on the miscibility of the first fluid with water. Once the first fluid is removed, the aqueous dispersion can more efficiently and quickly occupy the space left by the removed first fluid within the narrow channels or features, thereby accelerating the deposition of the dispersed colloidal dimensioned materials. Under this model, the physical properties of boiling point (or more generally, the vapor pressure at the then ambient temperature), the viscosity, and the surface tension of the first fluid all impact the efficiency of the method. It is also determined that the density of the first fluid relative to that of water is important, the method improving as the density of the first fluid decreases, relative to that of water, such that the density difference is increased. Certain embodiments, then, provide that the specific gravity of the first fluid be in the range of about 0.5 to about 1.1, in the range of about 0.6 to about 0.95, more preferably in the range of about 0.6 to about 0.85, more preferably in the range of about 0.6 to about 0.75, and more preferably in the range of about 0.6 to about 0.65, where specific gravity is defined as the ratio of the density of the fluid, typically at 25° C. to that of water, when measured at 4° C.

In certain embodiments, this first fluid may be immiscible, partially miscible, or completely miscible with water and/or the aqueous dispersions of the colloidal particles. The term "immiscible" as used herein, refers to a fluid exhibiting a mutual solubility with water at 25° C. of less than about 5%. "Partially miscible" is defined as exhibiting a mutual solubility with water at 25° C. in the range of about 5 to about 95%, and "completely miscible" refers to liquids which exhibit mutual solubility with water at 25° C. of more than about 95%.

As applied to vapor pressure, a convenient (if not surrogate) measure is the normal boiling point (i.e., the boiling point at one atmosphere) is an important property of the first fluid. In certain embodiments, the normal boiling point of the first fluid is about 99° C. or less, about 80° C. or less, more preferably about 60° C. or less, more preferably about 50° C. or less, still more preferably about 40° C. or less.

As applied to viscosity, certain embodiments provide that the viscosity of the first fluid be about 2 centipoise or less, at 25° C., more preferably about 1 centipoise or less, still more preferably about 0.5 centipoise or less, at 25° C.

With respect to surface tension, certain embodiments provide that the surface tension at 25° C. be about 40 dyne/cm or less, more preferably about 25 dyne/cm or less, and still more preferably in the range of about 20 to about 25 dyne/cm.

The more preferable embodiments for the first fluid exhibit the combination of properties characterized above as more or most preferable embodiments of the respective property. For example, one such category would include those fluids having specific gravities of about 0.85 or less, surface tensions of about 25 dyne/cm or less, and normal boiling points of about 85° C. or less.

The attached Table provides characteristic values for these parameters, for selected solvents. While not intended to be limiting, the Table provides allows the skilled artisan to select a first fluid with the balance of properties appropriate for his or her conditions.

|  | Surface Tension (dyn/cm) | Normal Boiling Point, 1 atm | Temp. at which 400 mmHg | Viscosity at 25° C. (centipoise) | Specific Gravity |
|---|---|---|---|---|---|
| Acetone | 23.3 | 56.3 | 39.5 | 0.316 | 0.792 |
| Acetonitrile | 19.1 | 81.6 | 62.5 | 0.345 | 0.786 |
| Benzene | 28.9 | 80.1 | 61 | 0.652 (20° C.) | 0.879 |
| tert-Butanol | 23.6 | 82.5 | 68 | 2.54 | 0.779 |
| n-Butyl Chloride | 23.8 | 77.8 | 59 | 0.469 (15° C.) | 0.887 |
| Carbon Tetrachloride | 27.0 | 76.7 | 58 | 0.969 (20° C.) | 1.595 |
| Chloroform | 27.2 | 61.2 | 43 | 0.542 | 1.489 |
| Cyclohexane | 25.0 | 80.7 | 61 | 1.02 (17° C.) | 0.779 |
| Cyclopentane | 22.4 | 49.3 | 31 | 0.493 (14° C.) | 0.745 |
| Dichloromethane | 28.1 | 39.8 | 24 | 0.449 (15° C.) | 1.336 |
| Diethyl Ether | 17.1 | 34.6 | 18 | 0.222 | 0.708 |
| Ethanol | 22.3 | 78.3 | 64 | 1.200 (20° C.) | 0.789 |

-continued

|  | Surface Tension (dyn/cm) | Normal Boiling Point, 1 atm | Temp. at which 400 mmHg | Viscosity at 25° C. (centipoise) | Specific Gravity |
|---|---|---|---|---|---|
| Ethyl Acetate | 23.7 | 77.1 | 59 | 0.441 | 0.901 |
| Ethylene Dichloride | 32.2 | 83.5 | 64 | 0.79 (20° C.) | 1.256 |
| Heptane | 20.3 | 98.4 | 78 | 0.386 | 0.684 |
| Hexane | 17.9 | 68.7 | 50 | 0.294 | 0.659 |
| Methanol | 22.6 | 64.7 | 50 | 0.547 | 0.792 |
| Methyl Ethyl Ketone | 24.0 | 79.6 | * | 0.426 (20° C.) | 0.805 |
| Methyl t-Butyl Ether | 19.4 | 55.2 | * | 0.36 | 0.740 |
| iso-Propyl Alcohol | 21.8 | 82.3 | 68 | 1.96 | 0.789 |
| n-Propyl Alcohol | 23.7 | 97.2 | 82 | 2.256 (20° C.) | 0.804 |
| Pentane | 15.5 | 36.1 | 19 | 0.24 | 0.630 |
| Tetrahydrofuran | 26.4 | 66 | * | 0.48 | 0.888 |
| Triethylamine | 20.7 | 89 | * | 0.363 | 0.729 |
| Water | 72.8 | 100 | 83 | 0.890 | 1.000 |

Values for these properties taken from various sources including R. H. Perry and C. H. Chilton, Chemical Engineers' Handbook 5th Edition, McGraw-Hill, 1973 and Handbook of Chemistry and Physics, CRC Press, 1982.

The aqueous layer comprises water and colloidal particles. It may also contain other materials, including surfactants, colorants, fluorescents, markers, preservatives, and/or soluble dopants depending on the final application. Virtually any potentially available secondary material can be used, provided they do not substantively interfere with the ability of the layer to deliver and deposit the colloidal particles to the surface of the substrate.

As with many of the other parameters, the invention is flexible in its choice of colloidal particles, both size and composition. While the terms "colloidal" has been used to describe "micro-" and/or "nano-" dimensioned particles, with the terms "micro-" and "nano-" having been described above, the colloidal particles may also be characterized in terms of aspect ratio—i.e., the ratio of the longest to shortest dimension. While there is no a priori limit to the aspect ratio for the present invention, preferred embodiments, particularly for those cases where the skilled artisan is depositing these colloidal particles in high aspect ratio channels or holes, are those where the particle aspect ratio is less than about 100, less than about 10, less than about 2, or spherical or near spherical.

These colloidal particles may comprise at least one allotrope of carbon, a glass, organic polymer, bioactive material, magnetic material, inorganic materials, ceramic, inorganic salt, metal or metalloid, or a combination or mixture thereof. The types of glasses, organic and inorganic polymers, ceramics, metals, and metalloids may be the same materials as described above in the context of the substrates. Additionally, inorganic salts may include photonic or similar materials, for example including CdS or AgCl. Allotropes of carbon, inorganic materials, metals, metalloids include carbon or inorganic nanotubes, graphenes, fullerenes, or functionalized/addivated version thereof, said nanotubes defined herein to include single-walled nanotubes, multi-walled nanotubes. In addition to the organic materials described above, the colloidal particles may also comprise at least one biopolymer, said biopolymer including peptides, nucleotides, or polynucleotides. The term "bioactive material" refers to a material capable of eliciting a pharmacological response in a patient.

The particles may comprise crystalline, non-crystalline (amorphous), or a mixture of crystalline and non-crystalline materials. Particles may be charged or uncharged.

The colloidal particles may include single materials or multiple materials. In the latter case, the particles may comprise composites wherein one component is intimately mixed with one or more different materials, wherein one component is intimately mixed with a different physical form of the same material (such as where a microcrystalline form of a material is homogeneously or heterogeneously contained within an amorphous form of the same material), wherein multiple material or forms of materials are arranged in layers, or combinations thereof. Included in such arrangements are those embodiments wherein, for example, optionally coated nanotubes contain fill materials, such as functionalized, unfunctionalized, substituted, and/or unsubstituted fullerenes, metallocenes, organic polymers, inorganic molecules, polymers, or salts, metal or metalloid, metallic cluster, molecular cluster, semiconducting cluster, semi-metallic cluster, or insulating cluster.electron donor or acceptor to said nanotube, or a molecule neutral to said nanotube or a mixture thereof.

Provided the dispersion remains fluid, there is no specific limit to the loading of the colloidal particles within the aqueous second layer. Preferably, the aqueous dispersion comprises particles in the range of about 0.1 to about 25% by weight relative to the weight of the entire aqueous dispersion, though various separate embodiments of this invention also provide that dispersions may include those containing in the range of about 0.1 to about 90 wt %, about 0.1 to about 50%, about 0.1 to about 25%, about 0.1 to about 20%, about 0.1 to about 15%, about 0.1 to about 10%, about 0.1 to about 5% by weight, or in the range of about 1 to about 90 wt %, about 1 to about 50%, about 1 to about 25%, about 1 to about 20%, about 1 to about 15%, about 1 to about 10%, about 1 to about 5% by weight, or in the range of about 5 to about 10%, about 10 to about 20%, about 20 to about 30%, about 30 to about 40%, about 40 to about 50%, or about 50 to about 60% by weight relative to the weight of the entire aqueous dispersion, again provided the dispersion remains fluid. The skilled artisan is well able to determine optimal loadings of the aqueous dispersion: at higher loadings, the channels, trenches, holes, wells, or vias tend to fill preferentially to the whole surface.

In still other embodiments, the aqueous dispersion further comprises an internally dispersed phase of a partially immiscible or immiscible liquid, these terms having been defined above, wherein some portion of the colloidal particles is positioned within the internally dispersed liquid phase. Separate embodiments also provide that some portion of the colloidal particles are positioned at the interface between the aqueous and the internally dispersed liquid phase. As used herein, "some of" is given its common meaning, that being "less than all." More specific embodiments describe the situation where the portion of the colloidal particles positioned within or at the interface of the between the aqueous and the internally dispersed liquid phase is about 10%, about 20%, about 30%, about 40%, about 50%, about 60%, about 70%, about 80%, about 90%, or more, by weight relative to the weight of the entire aqueous dispersion.

The invention also teaches that other embodiments of the method include those wherein the colloidal particles further comprise a ligand or surfactant. These ligands or surfactants may be chemically bonded, electrostatically attached, or physically entangled with the colloidal particles.

The optional cover plate has several effects on the methods described herein. In addition to promoting a uniformly thick coating of the two fluid layers, the presence (or absence) of the plate affects the homogeneity of the assembly on the surface and the time taken to remove the fluids. That is, in the absence of a cover plate, a "coffee ring" effect is noted with respect to the deposition of the colloidal material, where with the plate, the deposition is more uniform. Also, the presence of the cover plate extends the time it takes for the fluids to be removed. So as to give an indication of the gross effect, in non-limiting side-by-side experiments, at room temperature, evaporation times for uncovered substrates were on the order of 20-25 minutes, whereas covered substrates took between 90 and 120 minutes to dry. At 80° C., these times were less than one minute and 10-20 minutes, respectively The first layer may be removed using several techniques, including by the application of heat or vacuum or both. In such cases, the first layer may be removed by some contribution of evaporation or commingling with, and incorporating into, the aqueous phase, or both. Obviously, the contribution of each potential mechanism depends on the physical properties of the first fluid. The skilled artisan would appreciate, for example, that the contribution by evaporation would be more likely for a volatile, non-polar liquid than it would be for a relatively non-volatile, water miscible fluid, and that the efficiency of such a mechanism would be enhanced by the absence of edge sidewalls adjacent to the first fluid layer.

Once the first fluid is removed, and the colloidal particles are deposited, the invention describes that the liquid portion of the aqueous dispersion is removed by the application of heat or vacuum or both. Generally, the application of heat is referring to temperatures of about 99° C. or less, 80° C. or less, about 60° C. or less, about 40° C. or less, or so-call room ambient temperatures (e.g., ca. 20-25° C.). The skilled artisan will appreciate that higher temperatures will cause faster evaporation, though the speed of evaporation is balanced against the homogeneity and/or selectivity he or she wishes to attain.

As described above, additional embodiments include those wherein the colloidal particles remaining after the removal of the first and second layers of liquid form patterned deposits on the substrate. These deposits can be positioned over wide areas, or within constrained features, such as channels or holes. In some embodiments, the patterned layer of particles on the substrate form at least one electrical conductor or semiconductor device; e.g., a micro-/nano-wires or diode. In other embodiments, the patterns may comprise particles containing residual surfactants, ligands, or biopolymers, making them particularly suitable for sensor applications. In still other embodiments, the patterns may comprise photosensitive or photoactive materials, making them suitable for photonic applications. In still other applications, the patterns may comprise magnetic materials, making them particularly suitable for information storage or transfer applications.

To this point, the various embodiments of this invention have described methods for depositing colloidal particles onto a substrate surface. However, it should be appreciated that articles produced by these methods are also within the scope of this invention. Such articles include, for example, chemical, biochemical, electrical, electromagnetic field or frequency sensors, information storage media, energy storage units, energy conversion cells, display devices, or video or optical devices. More complicated systems are also contemplated herein, including chemical, biochemical, electrical, or electromagnetic field or frequency sensing systems, information transfer or communication systems, energy storage or conversion systems, or video or optical communication systems comprising a device made by these methods.

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Further, to the extent that the descriptions provided for the methods of improving the interfacial self-assembly processes are not specifically reflected in the descriptions for the articles produced by this methods, it should be readily apparent that these are considered to be within the scope of the latter, and vice versa. Similarly, it will be appreciated that any described material, feature, or device may be used in combination with any other material, feature, or device, so as to provide a flexible toolkit of options.

The disclosures of each patent, patent application, and publication cited or described in this document are hereby incorporated herein by reference, in their entirety.

What is claimed:
1. A method for depositing colloidal particles onto a substrate comprising:
   (a) providing a substrate having a surface;
   (b) depositing a first fluid onto the surface of the substrate to form a first layer;
   (c) depositing an aqueous dispersion of colloidal particles as a second layer on top of the first layer to form a two-layered fluid system;
   (d) optionally covering the second layer with a cover so as to form an assembly comprising a sandwich of the first and second layers between the substrate and the cover;
   (e) removing the first layer; and
   (f) removing water from the second layer, leaving a layer of colloidal particles on the surface of said substrate.
2. The method of claim 1 wherein the substrate is hydrophobic.
3. The method of claim 1 wherein the substrate is hydrophilic.
4. The method of claim 1 wherein the substrate comprises one or more materials selected from the group consisting of glass, organic polymer, inorganic polymer, ceramic, metal, metalloid, and a layered combination or mixture thereof.
5. The method of claim 1 wherein the substrate comprises a non-metallic surface that is at least partly metallized.
6. The method of claim 5 wherein the metallization is lithographically patterned.

7. The method of claim 4 wherein the substrate comprises glass and the glass comprises a silicate, borate, or phosphate, or combination or mixture thereof.

8. The method of claim 4 wherein the substrate comprises an organic polymer and the organic polymer comprises a thermoplastic or thermoset resin or copolymer or mixture thereof.

9. The method of claim 4 wherein the substrate comprises an organic polymer and the organic polymer comprises a partially or perfluorinated polymer, polycarbonate, polyester, polyalkylene, polyacrylate or polymethacrylate, polystyrene, or polyacrylonitrile, or a copolymer or mixture thereof.

10. The method of claim 4 wherein the substrate comprises an organic polymer and the organic polymer is electrically conductive or semi-conductive.

11. The method of claim 10 wherein the organic polymer comprisespoly(para-phenylene vinylene), polythiophene, poly(paraphenylene), polyquinoline, polypyrrole, polyacetylene, or polyfluorene, or a copolymer or mixture thereof.

12. The method of claim 4 wherein the substrate comprises an inorganic polymer and the inorganic polymer comprises a polysiloxane, silicate, or aluminosilicate, or a combination or mixture thereof.

13. The method of claim 4 wherein the substrate comprises a ceramic and the ceramic comprises a metal or metalloid oxide, nitride, or carbide, or a combination or mixture thereof.

14. The method of claim 13 wherein the substrate comprises a ceramic and the ceramic comprises aluminum oxide, aluminum nitride, aluminum carbide, titanium oxide, titanium nitride, titanium carbide, silicon oxide, silicon carbide, silicon nitride, boron carbide, boron nitride, antimony oxide, iron oxide, magnesium oxide, nickel oxide, tin oxide, zinc oxide, zirconium oxide, or a combination or mixture thereof.

15. The method of claim 4 wherein the substrate comprises a metal and the metal comprises aluminum, gold, silver, platinum, cadmium, copper, nickel, titanium, or iron, or a combination or mixture thereof.

16. The method of claim 4 wherein the substrate comprises a metalloid and the metalloid comprises conducting, semi-conducting, or insulating, doped or undoped Si, CdS, CdSe, Ge, GaAs, GaAlAs, ZnS, InP, or Ge, or a combination or mixture thereof.

17. The method of claim 4 wherein the substrate comprises silica, polyethylene, or polycarbonate.

18. The method of claim 1 wherein the substrate is rigid.

19. The method of claim 1 wherein the substrate is flexible.

20. The method of clam I wherein the substrate comprises patterned micro- or nano-dimensioned features.

21. The method of claim 20 wherein the patterned features present aspect ratios of 10or more.

22. The method of claim 20 wherein the patterned features present aspect ratios of 1 or more.

23. The method of claim 20 wherein the patterned features present aspect ratios of 100 or more.

24. The method of claim 1 wherein the first fluid wets the substrate.

25. The method of claim 1 wherein the first fluid comprises an organic fluid.

26. The method of claim 25 wherein the organic fluid comprises an alcohol, ester, or ketone.

27. The method of claim 25 wherein the first fluid comprises a liquid that is immiscible with water.

28. The method of claim 25 wherein the first fluid comprises a liquid that is partially miscible with water.

29. The method of claim 25 wherein the first fluid comprises a liquid that is completely miscible with water.

30. The method of claim 25 wherein the normal boiling point of the first fluid is about 99° C. or less.

31. The method of claim 25 wherein the normal boiling point of the first fluid is about 80° C. or less.

32. The method of claim 25 wherein the normal boiling point of the first fluid is about 60° C. or less.

33. The method of claim 25 wherein the normal boiling point of the first fluid is about 50° C. or less.

34. The method of claim 26 wherein the surface tension of the first fluid at 25° C. is 40 dynes/cm or less.

35. The method of claim 26 wherein the surface tension of the first fluid at 25° C. is 25 dynes/cm or less.

36. The method of claim 26 wherein the specific gravity of the first fluid is in the range of about 0.6 to about 0.95.

37. The method of claim 26 wherein the specific gravity of the first fluid is in the range of about 0.7 to about 0.85.

38. The method of claim 1 wherein the particles are nanoparticles.

39. The method of claim 1 wherein the colloidal particles comprise at least one allotrope of carbon, glass, organic polymer, inorganic polymer, ceramic, inorganic salt, metal or metalloid, or a combination or mixture thereof.

40. The method of claim 39 wherein the colloidal particles contain a fill material different from the remaining particle material, wherein the fill material comprises one or more allotropes of carbon, organic polymer, inorganic polymer, inorganic salt, metal or metalloid, or a mixture thereof.

41. The method of claim 1 wherein the aqueous dispersion comprises 0.1 to 25 wt % particles.

42. The method of claim 39 wherein the organic polymer comprises a biopolymer.

43. The method of claim 1 wherein the aqueous dispersion further comprises an internally dispersed phase of a partially immiscible or immiscible liquid.

44. The method of claim 43 wherein some portion of the colloidal particles are positioned within the internally dispersed liquid phase.

45. The method of claim 43 wherein some portion of the colloidal particles are positioned at the interface between the aqueous and the internally dispersed liquid phase.

46. The method of claim 1 wherein the colloidal particles further comprise a ligand or surfactant.

47. The method of claim 1 wherein the first layer is removed by the application of heat or vacuum or both.

48. The method of claim 47 wherein the first layer is removed by the application of heat.

49. The method of claim 47 wherein the first layer is removed by evaporation.

50. The method of claim 47 wherein the first layer is removed by comingling with, and incorporating into, the aqueous phase.

51. The method of claim 1 wherein the second layer is removed by the application of heat or vacuum or both.

52. The method of claim 1 wherein the particles remaining after the removal of the first and second layers of liquid form a patterned deposit of particles on the substrate.

53. The method of claim 52 wherein the patterned deposit of particles on the substrate forms an electrical conductor or semiconductor device.

* * * * *